United States Patent
Metz et al.

(10) Patent No.: US 10,861,939 B2
(45) Date of Patent: Dec. 8, 2020

(54) STIFF QUANTUM LAYERS TO SLOW AND OR STOP DEFECT PROPAGATION

(71) Applicant: INTEL CORPORATION, Santa Clara, CA (US)

(72) Inventors: Matthew Metz, Portland, OR (US); Gilbert Dewey, Hillsboro, OR (US); Harold W. Kennel, Portland, OR (US); Cheng-Ying Huang, Hillsboro, OR (US); Sean T. Ma, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 16/326,663

(22) PCT Filed: Sep. 30, 2016

(86) PCT No.: PCT/US2016/054676
§ 371 (c)(1),
(2) Date: Feb. 19, 2019

(87) PCT Pub. No.: WO2018/063290
PCT Pub. Date: Apr. 5, 2018

(65) Prior Publication Data
US 2019/0189753 A1   Jun. 20, 2019

(51) Int. Cl.
*H01L 29/12* (2006.01)
*H01L 21/02* (2006.01)
*H01L 29/20* (2006.01)

(52) U.S. Cl.
CPC ...... *H01L 29/122* (2013.01); *H01L 21/02543* (2013.01); *H01L 21/02546* (2013.01); *H01L 29/20* (2013.01)

(58) Field of Classification Search
CPC combination set(s) only.
See application file for complete search history.

(56) References Cited

U.S. PATENT DOCUMENTS 5,986,291 A * 11/1999 Currie ................. H01L 29/7786
257/192
2004/0150001 A1   8/2004 Shchukin et al.
(Continued)

FOREIGN PATENT DOCUMENTS

JP       2001237413 A    8/2001

OTHER PUBLICATIONS

PCT/US2016/054676, International Search Report and Written Opinion, dated Jun. 28, 2017, 12 pages.
(Continued)

*Primary Examiner* — Nduka E Ojeh
(74) *Attorney, Agent, or Firm* — Schwabe, Williamson & Wyatt, P.C.

(57) ABSTRACT

Semiconductor devices, computing devices, and related methods are disclosed herein. A semiconductor device includes a seed material, an epitaxial material in contact with the seed material, and at least one quantum region including an elastic stiffness that is greater than an elastic stiffness of the epitaxial material. The epitaxial material has lattice parameters that are different from lattice parameters of the seed material by at least a threshold amount. Lattice parameters of the quantum region are within the threshold amount of the lattice parameters of the epitaxial material. A method includes disposing an epitaxial material on a seed material, disposing a quantum region on the epitaxial material, and disposing the epitaxial material on the quantum region.

20 Claims, 5 Drawing Sheets

(56) References Cited

U.S. PATENT DOCUMENTS

| | | | |
|---|---|---|---|
| 2008/0142786 A1* | 6/2008 | Datta | H01L 29/7783 |
| | | | 257/24 |
| 2009/0127541 A1 | 5/2009 | Majhi et al. | |
| 2009/0173934 A1* | 7/2009 | Jain | H01L 29/66825 |
| | | | 257/20 |
| 2010/0051900 A1 | 3/2010 | Huffaker et al. | |
| 2014/0167098 A1* | 6/2014 | Cheng | B82Y 10/00 |
| | | | 257/104 |
| 2014/0264277 A1* | 9/2014 | Doornbos | B82Y 40/00 |
| | | | 257/24 |
| 2016/0034417 A1* | 2/2016 | Chavez | H04B 3/548 |
| | | | 710/110 |

OTHER PUBLICATIONS

International Preliminary Report on Patentability for PCT Application No. PCT/US2016/054676 dated Apr. 11, 2019, 9 pgs.

* cited by examiner

STIFF QUANTUM LAYERS TO SLOW AND OR STOP DEFECT PROPAGATION

RELATED APPLICATION(S)

This application is a national stage filing under 35 U.S.C. § 371 of International Patent Application No. PCT/US2016/054676, filed Sep. 30, 2016, which is hereby incorporated by reference herein in its entirety.

BACKGROUND

Electronic devices often include interfaces between different materials (e.g., semiconductor materials). Sometimes these materials include crystalline materials having different lattice parameters. One example of a structure that is sometimes used at an interface between different crystalline materials is an aspect ratio trapping (ART) trench.

DETAILED DESCRIPTION

Described herein are semiconductor devices, computing devices, and related methods for stiff quantum regions that prevent (e.g., stop, slow, change direction, or a combination thereof) propagation of defects in a material. In the following description, various aspects of the illustrative implementations will be described using terms commonly employed by those skilled in the art to convey the substance of their work to others skilled in the art. However, it will be apparent to those skilled in the art that the disclosure may be practiced with only some of the described aspects. For purposes of explanation, specific numbers, materials, and configurations are set forth in order to provide a thorough understanding of the illustrative implementations. It will be apparent to one skilled in the art, however, that the disclosure may be practiced without the specific details. In other instances, well-known features are omitted or simplified in order not to obscure the illustrative implementations.

Various operations will be described as multiple discrete operations, in turn, in a manner that is most helpful in understanding the disclosure. The order in which the operations are presented in the description, however, should not be construed to imply that these operations are necessarily order dependent. In particular, these operations need not be performed in the order of presentation. Rather, in some embodiments, the order may be modified.

The terms "over," "under," "between," and "on," as used herein, refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers. Also, as used herein, the terms "elastic stiffness," "stiff," and derivatives of these terms refer to the modulus of elasticity (also known as "elastic modulus, tensile modulus, Young's modulus, etc.). Furthermore, unless otherwise explicitly indicated otherwise, as used herein, the term "conductive" refers to electrically conductive.

Implementations of the disclosure may be formed or carried out on a substrate, such as a semiconductor substrate. In one implementation, the semiconductor substrate may be a crystalline substrate formed using a bulk silicon or a silicon-on-insulator (SOI) substructure (e.g., silicon-on-glass (SOG), silicon-on-sapphire (SOS), etc.). In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although implementations described herein may refer to planar transistors, it should be noted that the implementations may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may include at least one P-type workfunction metal or N-type workfunction metal, depending on whether the transistor is to be a PMOS or an NMOS transistor. In some implementations, the gate electrode layer may include of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may include a "U-shaped" structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may include one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. In further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

In some instances, a semiconductor device may include interfaces between different crystalline materials having different crystal structures. When growing lattice mismatched materials (heteroepitaxy), strain energy builds in a material epitaxially formed on a mismatched seed material. Defects in the epitaxial material form to relieve the strain energy. These defects may sometimes propagate to active regions (e.g., channel and/or source/drain regions), and decrease performance of devices (e.g., transistors) on or in the epitaxial material. By way of non-limiting example, defects that may form responsive to a lattice mismatch may include misfit dislocations (which may develop into threading dislocations), glide plane, stacking fault, other defects, or combinations thereof. These defects are likely to start forming if a critical thickness (e.g., an angstrom or two) of material is formed on a mismatched material with a lattice mismatch of between about 4% or more.

Embodiments disclosed herein include elastically stiff quantum materials disposed in an epitaxial material to prevent propagation of defects due to lattice mismatch from propagating into functional features (e.g., transistors, other devices, etc.) of the epitaxial material. The elastically stiff quantum materials may bend, redirect, and/or annihilate defects in the epitaxial material to prevent the defects from propagating into the functional features. Addition of elastically stiff quantum materials to stop or modify defect propagation (e.g., in aspect ratio trapping (ART) trenches or otherwise) may improve film quality and resultant device (e.g., transistor) performance.

Figure 1:
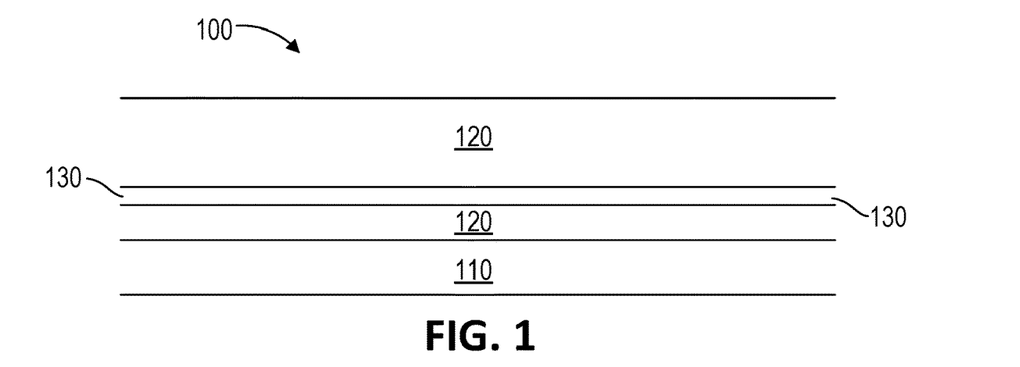
FIG. 1 is a simplified cross-sectional view of a semiconductor device, according to some embodiments.

FIG. 1 is a simplified cross-sectional view of a semiconductor device 100, according to some embodiments. The semiconductor device 100 includes a seed material 110, an epitaxial material 120 having a lattice mismatch with the seed material 110, and a quantum region 130 in the epitaxial material 120 to prevent propagation of defects resulting from the lattice mismatch. As used herein, the term "lattice mismatch" refers to a difference in lattice parameters between materials that exceeds a threshold level (e.g., 2%, 3%, 4%, etc.). By way of non-limiting example, a lattice mismatch exists between silicon and gallium arsenide (e.g., about a 4% difference in lattice constant). Accordingly, the seed material 110 may include silicon, and the epitaxial material 120 may include gallium arsenide. Also by way of non-limiting example, a lattice mismatch exists between gallium arsenide and indium gallium arsenide (e.g., about a 4% difference in lattice constant) when the film composition is ~$In_{53}Ga_{47}As$. Accordingly, the seed material 110 may include gallium arsenide and the epitaxial material 120 may include indium gallium arsenide. As a further non-limiting example, the seed material 110 may include silicon, and the epitaxial material 120 may include any one of several different III-V semiconductor materials. Many other combinations of materials for the seed material 110 and the epitaxial material 120 will be apparent to those of ordinary skill in the art, and an exhaustive listing of the possibilities is not attempted herein in the interest of simplicity.

The quantum region 130 includes a material that has an elastic stiffness that is greater than an elastic stiffness of the epitaxial material 120. Also, the quantum region 130 may have similar lattice parameters to those of the epitaxial material 120 (e.g., within the threshold level). By way of non-limiting example, if the epitaxial material 120 includes gallium arsenide (GaAs), the quantum region 130 may include indium phosphide (InP). Also by way of non-limiting example, if the epitaxial material 120 includes indium gallium arsenide (InGaAs), the quantum region 130 may include indium aluminum arsenide (InAlAs).

The quantum region 130 is relatively thin to prevent the quantum region 130 itself from causing defects in the epitaxial material 120. For example, the quantum region 130 may be about one half of one nanometer thick to about five nanometers thick. By keeping the quantum region relatively thin, defects may be avoided.

In some embodiments, one or more electronic devices may be formed on or in the epitaxial material 120 above the quantum region 130. Accordingly, the quantum region 130 may be configured to prevent propagation of defects into a portion of the epitaxial material on or in which the electronic devices may be formed. In some embodiments, the quantum region 130 may be configured to electrically and/or thermally isolate the epitaxial material 120 above the quantum region 130 from material below the quantum region 130.

In some embodiments, a single quantum region 130 may not be sufficient to prevent defect propagation. In such embodiments, multiple quantum regions 130 may be used, such as in an example illustrated in FIG. 2.

Figure 2:
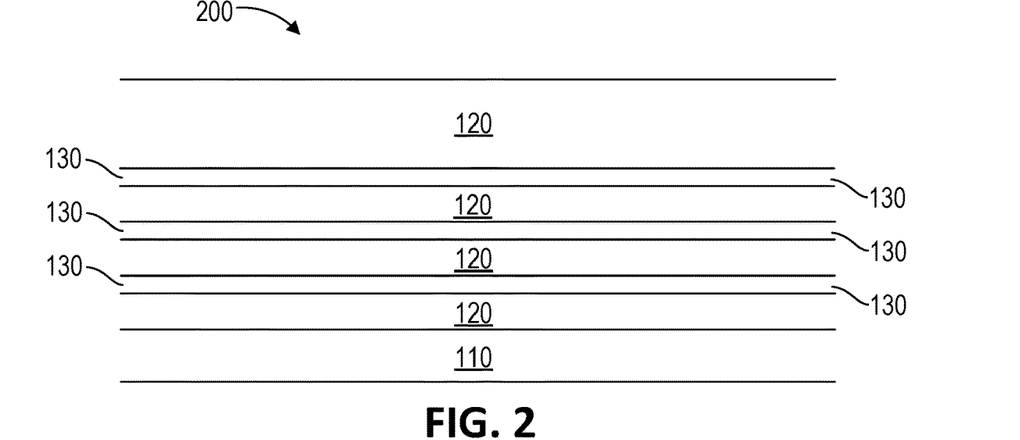
FIG. 2 is a simplified cross-sectional view of a semiconductor device, according to some embodiments.

FIG. 2 is a simplified cross-sectional view of a semiconductor device 200, according to some embodiments. The semiconductor device 200 includes a seed material 110 and an epitaxial material 120, similar to the seed material 110 and the epitaxial material 120 of FIG. 1. The semiconductor device 200 also includes quantum regions 130, each similar to the quantum region 130 of FIG. 1. Each of the quantum regions 130 may be relatively thin, as discussed above, to prevent defects from arising due to a single, relatively thick quantum region. In the aggregate, the quantum regions 130 may provide more total elastic stiffness than the single quantum region 130 of FIG. 1. Accordingly, all other things being equal, the semiconductor device 200 may be less prone to defect propagation due to lattice mismatch between the seed material 110 and the epitaxial material 120 than the semiconductor device 100.

In some embodiments, each of the quantum regions 130 include the same material. In some embodiments, one or more of the quantum regions 130 include a material that is different from others of the quantum regions 130. Also, in some embodiments, one or more of the quantum regions 130 may have a thickness that is different from others of the quantum regions 130.

Figure 3:
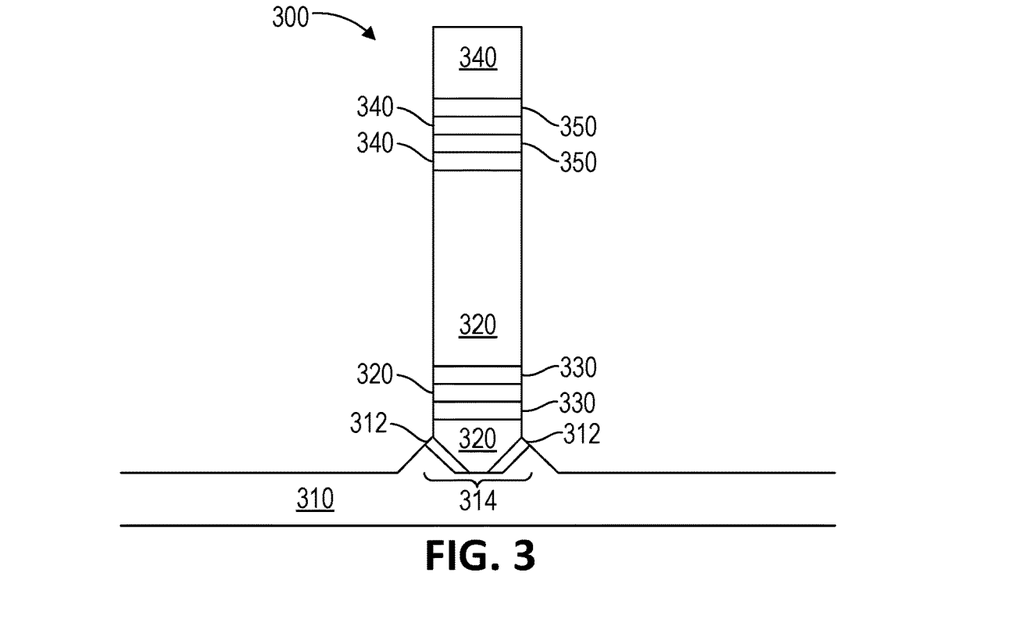
FIG. 3 is a simplified cross-sectional view of a semiconductor device, according to some embodiments.

Although the example semiconductor device 200 illustrated in FIG. 3 includes three quantum regions 130, it is contemplated herein that in some embodiments, any number of quantum regions 130 may be included. By way of non-limiting example, any number of quantum regions 130 between about one and fifty quantum regions 130 may be included.

FIG. 3 is a simplified cross-sectional view of a semiconductor device 300, according to some embodiments. The semiconductor device 300 includes a seed material 310 including an aspect ratio trapping (ART) trench 314 formed therein or thereon. By way of non-limiting example, the seed material 310 may include silicon. Also by way of non-limiting example, the ART trench 314 may include oxide walls 312 (e.g., silicon dioxide).

The semiconductor device 300 also includes an epitaxial material 320 on the seed material 310 in the ART trench 314. The epitaxial material 320 has lattice parameters associated therewith that are different from lattice parameters of the seed material 310 by at least a threshold amount. By way of non-limiting example, the lattice parameters of the epitaxial material 320 may be different from lattice parameters of the seed material 310 by at least about three percent (3%). As a specific, non-limiting example, a lattice constant of the epitaxial material 320 may be different from a lattice constant of the seed material 310 by at least the threshold amount. Accordingly, defects may have formed in the epitaxial material due to the strain resulting from the lattice mismatch between the seed material 310 and the epitaxial material 320.

In some embodiments, the epitaxial material 320 includes a III-V semiconductor material (e.g., gallium arsenide (GaAs)). For example, if the seed material 310 includes silicon and the epitaxial material 320 includes GaAs, the difference between the lattice constant of the seed material 310 and the epitaxial material 320 may be about four percent (4%). This difference in lattice constant is sufficient to amount to a lattice mismatch between the seed material 310 and the epitaxial material 320. Accordingly, the epitaxial material 320 may include defects near the interface between the seed material 310 and the epitaxial material 320 resulting from strain energy created during formation of the epitaxial material 320 on the seed material 310.

The semiconductor device 300 further includes quantum regions 330 through the epitaxial material 320. The quantum regions 330 are configured to prevent the defects in the epitaxial material 320 resulting from the mismatch between the epitaxial material 320 and the seed material 310 from propagating above the quantum regions 330. The quantum regions 330 have an elastic stiffness that is greater than an elastic stiffness of the epitaxial material 320. Accordingly, the defects may not propagate through the quantum regions 330 due to their elastic stiffness. A number of the quantum regions may be in the range of one to about fift quantum regions 330. By way of non-limiting example, the number of the quantum regions may be between about three and six quantum regions.

The quantum regions 330 are relatively thin (e.g., about half of a nanometer to about five nanometers) and have lattice properties associated therewith that are within the threshold of the lattice properties of the epitaxial material 320 to prevent defects from forming due to the quantum regions 330 themselves. By way of non-limiting example, a lattice constant of the quantum regions 330 may be within about two or three percent (2%-3%) of a lattice constant of the epitaxial region 320. As a specific, non-limiting example, if the epitaxial region 320 includes GaAs, the quantum regions 330 may include indium phosphide (InP) or indium aluminum arsenide (InAlAs) (because InP and InAlAs have a greater elastic stiffness than GaAs, and lattice parameters relatively close (i.e., within the threshold) of the lattice parameters of GaAs).

The semiconductor device 300 includes another epitaxial material 340 on the epitaxial material 320. A lattice mismatch exists between the epitaxial materials 320 and 340 (i.e., there is at least the threshold level of difference between the lattice parameters of the epitaxial materials 320 and 340). By way of non-limiting example, the epitaxial material 320 may include GaAs, and the epitaxial material 340 may include indium gallium arsenide (InGaAs). The semiconductor device 300 also includes quantum regions 350 similar to the quantum regions 330 through the epitaxial material 340 to prevent propagation of defects, as previously discussed. By way of non-limiting example, the quantum regions 330 may include InP, InAlAs, or some other material that fits the properties (e.g., greater elastic stiffness than epitaxial material 340 and lattice match to epitaxial material 340) discussed above.

Figure 4A:
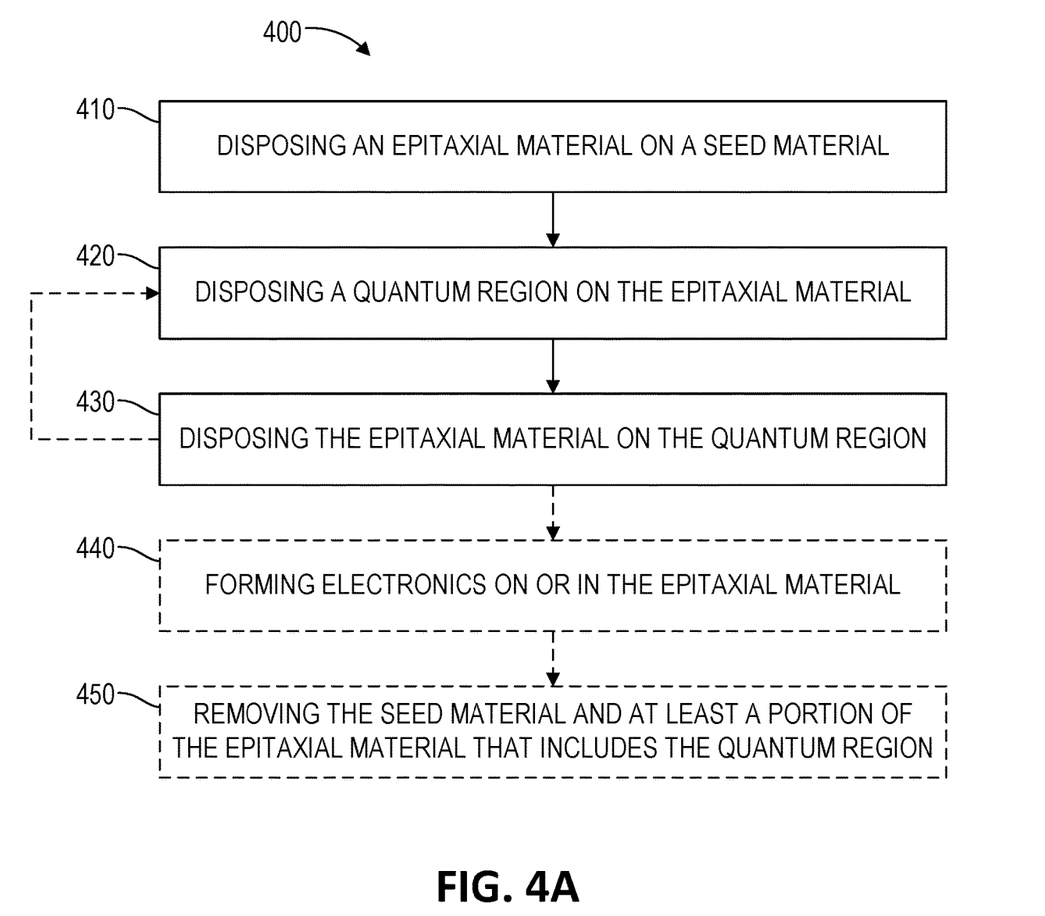
FIGS. 4A-4F illustrate a simplified method of forming a semiconductor device, according to some embodiments.

FIGS. 4A-4F illustrate a simplified method 400 of forming a semiconductor device 100A (e.g., the semiconductor device 100, 200, and/or 300 of FIG. 1, 2, or 3, respectively), according to some embodiments. FIG. 4A is a simplified flowchart illustrating the method 400. FIGS. 4B-4F are simplified cross-sectional views of the semiconductor device 100A responsive to various acts 410-450, respectively, of the method 400.

Figure 4B:
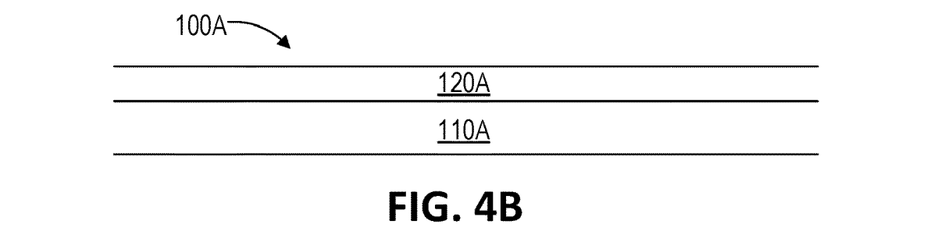

Referring to FIGS. 4A-4F together, the method 400 includes disposing 410 an epitaxial material 120A on a seed material 110A. The seed material 120A has a first set of lattice parameters associated therewith, and the epitaxial material 120A has a second set of lattice parameters associated therewith that is different from the first set of lattice parameters by at least a threshold amount (e.g., 3%, 4%, etc.). Also, the epitaxial material 120A has a first elastic stiffness. FIG. 4B illustrates the epitaxial material 120A on the seed material 110A. In some embodiments, disposing 410 an epitaxial material 120A on a seed material 110A includes disposing the epitaxial material 120A in an ART trench. In some embodiments, disposing 410 an epitaxial material 120A on a seed material 110A includes disposing GaAs on silicon. In some embodiments, disposing 410 an epitaxial material 120A on a seed material 110A includes disposing InGaAs on GaAs.

Figure 4C:
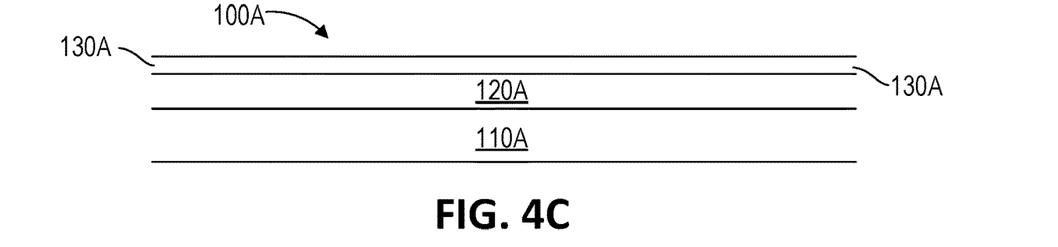
Figure 4D:
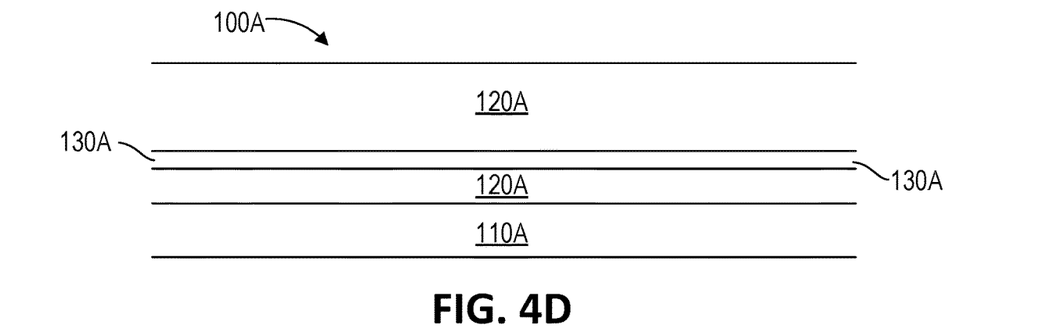

The method 400 also includes disposing 420 a quantum region 130A on the epitaxial material 120A. The quantum region 130A has a second elastic stiffness that is greater than the first elastic stiffness of the epitaxial material 120A. The quantum region 130A also has a third set of lattice parameters associated therewith that is within the threshold amount of the second set of lattice parameters. FIG. 4D illustrates the quantum region 130A on the epitaxial material 120A. In some embodiments, disposing 420 a quantum region 130A includes disposing about one half to five nanometers of material of the quantum region 130A.

The method 400 further includes disposing 430 the epitaxial material 120A on the quantum region 130A. FIG. 4C illustrates the quantum region 130A on the epitaxial material 120A.

In some embodiments, acts 420 and 430 may be repeated (e.g., one time, multiple times) to provide multiple quantum regions 130A, resulting in a semiconductor device 100A similar to the semiconductor devices 200 and 300 of FIGS. 2 and 3, respectively. In some embodiments, acts 420 and 430 may not be repeated, resulting in a semiconductor device 100A similar to the semiconductor device 100 of FIG. 1. In some embodiments, acts 410 through 430 may be repeated (e.g., resulting in a structure similar to the semiconductor device 300 of FIG. 3, which includes multiple interfaces between mismatched materials).

Figure 4E:
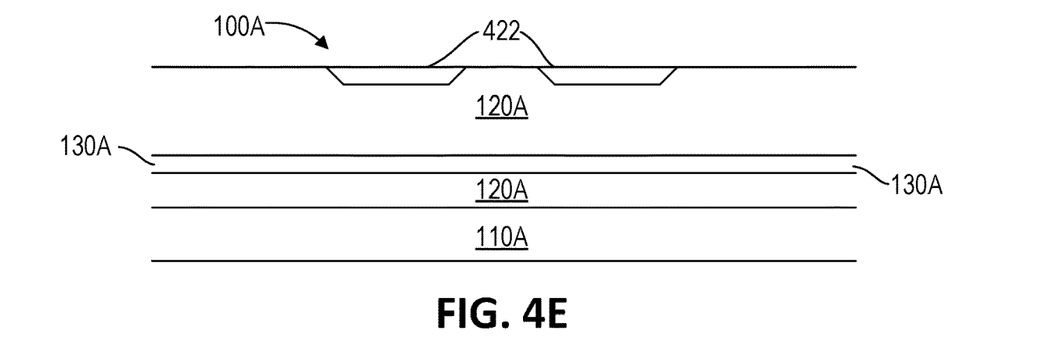

Regardless of how some or all of acts 410, 420, and 430 are or are not repeated, in some embodiments, the method 400 includes forming 440 electronics 422 (e.g., transistors, diodes, capacitors, etc.) on or in the epitaxial material 120A. FIG. 4E shows the electronics 422 in the epitaxial material 120A. By way of non-limiting example, forming 440 electronics 422 on or in the epitaxial material 120A includes forming electronics for a processor, a memory unit, a graphics processing unit, other devices, or combinations thereof.

Figure 4F:
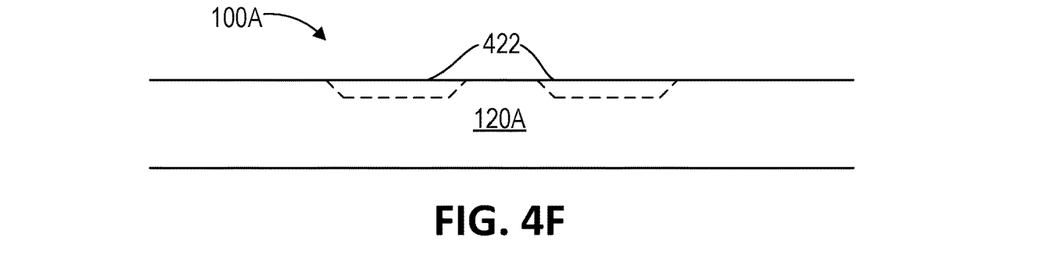

In some embodiments, the method 400 includes removing 450 the seed material 110A and at least a portion of the epitaxial material 120A that includes the quantum region 130A or quantum regions 130A. Accordingly, as shown in FIG. 4F, a largely defect-free portion of the epitaxial material 120A remains. In some embodiments, the defect-free portion of the epitaxial material 120A includes the electronics 422 formed therein or thereon. In some embodiments, act 450 may not be performed, leaving the semiconductor device 100A of FIG. 4D or FIG. 4E.

Figure 5:
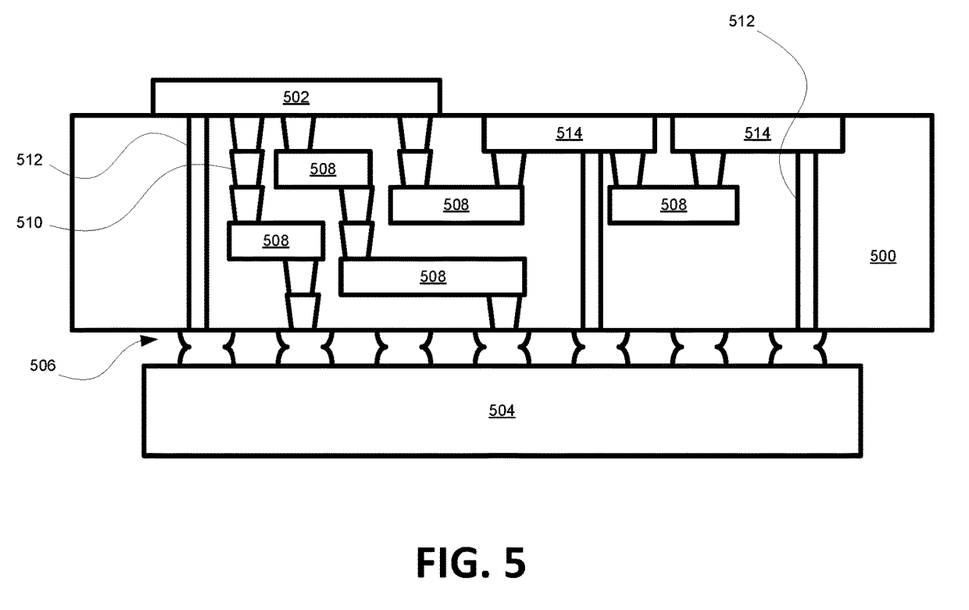
FIG. 5 illustrates an interposer that includes one or more embodiments disclosed herein.

FIG. 5 illustrates an interposer 500 that includes one or more embodiments disclosed herein. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with some embodiments, apparatuses or processes disclosed herein may be used in the fabrication of interposer 500.

Figure 6:
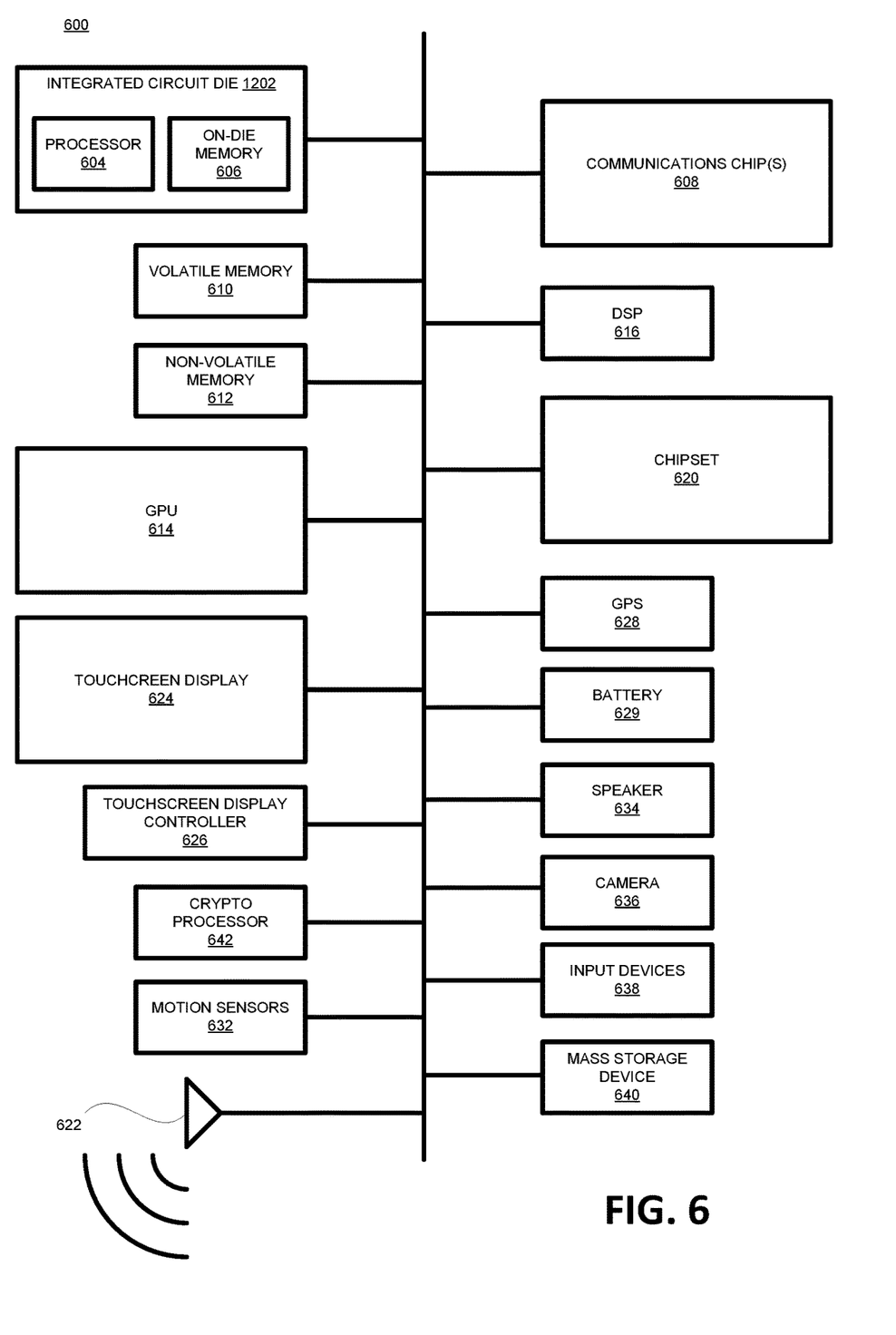
FIG. 6 illustrates a computing device, according to some embodiments.

FIG. 6 illustrates a computing device 600, according to some embodiments. The computing device 600 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a CPU 604 as well as on-die memory 606, often used as cache memory, that can be provided by technologies such as embedded DRAM (eDRAM), SRAM, or spin-transfer torque memory (STT-MRAM).

Computing device 600 may include other components that may or may not be physically and electrically coupled to the motherboard or fabricated within an SoC die. These other components include, but are not limited to, volatile memory 610 (e.g., DRAM), non-volatile memory 612 (e.g., ROM or flash memory), a graphics processing unit 614 (GPU), a digital signal processor 616, a crypto processor 642 (e.g., a specialized processor that executes cryptographic algorithms within hardware), a chipset 620, at least one antenna 622 (in some implementations two or more antennas may be used), a display or a touchscreen display 624, a touchscreen controller 626, a battery 628 or other power source, a power amplifier (not shown), a voltage regulator (not shown), a global positioning system (GPS) device 628, a compass 630, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as the semiconductor device 100, 200, or 300 discussed above with reference to FIGS. 1, 2, and 3, respectively. The term "processor" may refer to any device or portion of a device that processes electronic data from registers and/or memory to transform that electronic data into other electronic data that may be stored in registers and/or memory.

The communications logic unit 608 may also include one or more devices, such as the semiconductor device 100, 200, or 300 discussed above with reference to FIGS. 1, 2, and 3, respectively.

In further embodiments, another component housed within the computing device 600 may contain one or more devices, such as the semiconductor device 100, 200, or 300 discussed above with reference to FIGS. 1, 2, and 3, respectively.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

The following is a list of example embodiments that fall within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below, and the above disclosed embodiments, are not combinable, it is contemplated within the scope of the disclosure that such examples and embodiments are combinable.

Example 1

A semiconductor device comprising: a seed material having a first set of lattice parameters associated therewith; an epitaxial material in direct physical contact with the seed material, the epitaxial material having a second set of lattice parameters associated therewith that are different from the first set of lattice parameters by at least a threshold amount; and at least one quantum region comprising a material that has an elastic stiffness that is greater than an elastic stiffness of the epitaxial material and a third set of lattice parameters that are within the threshold amount from the second set of lattice parameters, the at least one quantum region disposed within the epitaxial material.

Example 2

The semiconductor device of Example 1, wherein the seed material includes a crystalline silicon material.

Example 3

The semiconductor device according to any one of Examples 1 and 2, wherein the seed material includes an aspect ratio trapping (ART) trench thereon, and the epitaxial material is disposed in the ART trench.

Example 4

The semiconductor device according to any one of Examples 1-3, wherein the epitaxial material includes an active region including an electronic device therein or thereon and a passive region including the at least one quantum region therein.

Example 5

The semiconductor device according to any one of Examples 1-4, further comprising: a crystalline material in direct physical contact with the epitaxial material, the crystalline material having a fourth set of lattice parameters associated therewith that are different from the second set of lattice parameters by at least the threshold amount; and at least one other quantum region comprising a material that has an elastic stiffness that is greater than an elastic stiffness of the crystalline material and a fifth set of lattice parameters that are within the threshold amount from the fourth set of lattice parameters, the at least one other quantum region disposed within the crystalline material.

Example 6

The semiconductor device according to any one of Examples 1-5, wherein each one of the at least one quantum region is between about one half to five nanometers thick.

Example 7

The semiconductor device according to any one of Examples 1-6, wherein a number of quantum regions of the at least one quantum region is between one quantum region and twenty quantum regions.

Example 8

The semiconductor device according to any one of Examples 1-7, wherein the at least one quantum region comprises indium phosphide (InP).

Example 9

The semiconductor device according to any one of Examples 1-7, wherein the at least one quantum region comprises indium aluminum arsenide (InAlAs).

Example 10

The semiconductor device of according to any one of Examples 1-9, wherein the epitaxial material includes a III-V semiconductor material.

Example 11

The semiconductor device according to any one of Examples 1-10, wherein the threshold amount is about three percent (3%).

Example 12

The semiconductor device according to any one of Examples 1-10, wherein the threshold amount is between about two percent (2%) and four percent (4%).

Example 13

A method of forming a semiconductor device, the method comprising: disposing an epitaxial material on a seed material having a first set of lattice parameters associated therewith, the epitaxial material having a first elastic stiffness and a second set of lattice parameters associated therewith that is different from the first set of lattice parameters by at least a threshold amount; disposing a quantum region on the epitaxial material, the quantum region having a second elastic stiffness that is greater than the first elastic stiffness and a third set of lattice parameters associated therewith that is within the threshold amount of the second set of lattice parameters; and disposing the epitaxial material on the quantum region.

Example 14

The method of Example 13, further comprising disposing another quantum region having the second elastic stiffness and the third set of lattice parameters associated therewith and disposing the epitaxial material on the another quantum region.

Example 15

The method of Example 14, wherein disposing another quantum region and disposing the epitaxial material on the another quantum region is repeated less than about fifty times.

Example 16

The method according to any one of Examples 13-15, wherein disposing an epitaxial material on a seed material includes disposing the epitaxial material in an aspect ratio trapping (ART) trench.

Example 17

The method according to any one of Examples 13-16, wherein disposing a quantum region comprises disposing about one half to five nanometers of material of the quantum region.

Example 18

A computing device comprising: a processor mounted on a substrate; a memory unit capable of storing data; a graphics processing unit; an antenna within the computing device; a display on the computing device; a battery within the computing device; a power amplifier within the processor; and a voltage regulator within the processor; wherein at least one of the processor, the memory unit, the graphics processing unit, or the voltage regulator comprises: an interface between a seed material and an epitaxial material, the epitaxial material having a second set of lattice parameters that is different from a first set of lattice parameters of the seed material by at least a threshold amount; and one or more quantum regions in the epitaxial material, the one or more quantum regions comprising a material that is elastically stiffer than the epitaxial material and that has a third set of lattice parameters that are within the threshold amount of the second set of lattice parameters.

Example 19

The computing device of Example 18, wherein the one or more quantum regions include indium phosphide (InP).

Example 20

The computing device of Example 18, wherein the one or more quantum regions include indium aluminum arsenide (InAlAs).

Example 21

A method of forming a semiconductor device, the method comprising: disposing a seed material having a first set of lattice parameters associated therewith; disposing an epitaxial material in direct physical contact with the seed material, the epitaxial material having a second set of lattice parameters associated therewith that are different from the first set of lattice parameters by at least a threshold amount; and disposing at least one quantum region comprising a material that has an elastic stiffness that is greater than an elastic stiffness of the epitaxial material and a third set of lattice parameters that are within the threshold amount form the second set of lattice parameters, the at least one quantum region disposed within the epitaxial material.

Example 22

The method of Example 21, wherein the disposing a seed material comprises disposing a crystalline silicon material.

Example 23

The method according to any one of Examples 21 and 22, wherein disposing an epitaxial material comprises disposing the epitaxial material within an aspect ratio trapping (ART) trench on the seed material.

Example 24

The method according to any one of Examples 21-23, wherein disposing an epitaxial material comprises disposing an active region of the epitaxial material including an active region having an electronic device therein or thereon and a passive region including at least one quantum region including the at least one quantum region therein.

Example 25

The method according to any one of Examples 21-24, further comprising: disposing a crystalline material in direct physical contact with the epitaxial material, the crystalline material having a fourth set of lattice parameters associated therewith that are different from the second set of lattice parameters by at least the threshold amount; and disposing at least one other quantum region comprising a material that has an elastic stiffness that is greater than an elastic stiffness of the crystalline material and a fifth set of lattice parameters that are within the threshold amount from the fourth set of lattice parameters, the at least one other quantum region disposed within the crystalline material.

Example 26

The method according to any one of Examples 21-25, wherein disposing at least one quantum region comprises disposing the at least one quantum region having a thickness of between about one half to five nanometers thick.

Example 27

The method according to any one of Examples 21-26, wherein disposing at least one quantum region comprises disposing between one quantum region and twenty quantum regions.

Example 28

The method according to any one of Examples 21-27, wherein disposing at least one quantum region comprises disposing indium phosphide (InP).

Example 29

The method according to any one of Examples 21-28, wherein disposing at least one quantum region comprises disposing indium aluminum arsenide (InAlAs).

Example 30

The method according to any one of Examples 21-29, wherein disposing an epitaxial material includes disposing a III-V semiconductor material.

Example 31

The method according to any one of Examples 21-30, wherein the threshold amount is about three percent (3%).

Example 32

The method according to any one of Examples 21-30, wherein the threshold amount is between about two percent (2%) and four percent (4%).

Example 33

A semiconductor device, comprising: an epitaxial material including a first portion disposed on a seed material having a first set of lattice parameters associated therewith, the epitaxial material having a first elastic stiffness and a second set of lattice parameters associated therewith that is different from the first set of lattice parameters by at least a threshold amount; a quantum region on the epitaxial material, the quantum region having a second elastic stiffness that is greater than the first elastic stiffness and a third set of lattice parameters associated therewith that is within the threshold amount of the second set of lattice parameters; and a second portion of the epitaxial material disposed on the quantum region.

Example 34

The semiconductor device of Example 33, further comprising: another quantum region disposed on the second portion of the epitaxial material and having the second elastic stiffness and the third set of lattice parameters associated therewith; and a third portion of the epitaxial material disposed on the another quantum region.

Example 35

The semiconductor device of Example 34, wherein the epitaxial material includes less than or equal to about fifty quantum regions disposed therein.

Example 36

The semiconductor device according to any one of Examples 33-35, further comprising an aspect ratio trapping (ART) trench on or in the seed material, at least a portion of the epitaxial material disposed in the ART trench.

Example 37

The semiconductor device according to any one of Examples 33-36, wherein a thickness of the quantum region is about one half to five nanometers.

Example 38

A method of assembling a computing device, the method comprising: mounting a processor on a substrate; connecting the processor including a voltage regulator to a memory unit capable of storing data; connecting the processor to a graphics processing unit; connecting the processor to an antenna within the computing device; connecting the processor to a display on the computing device; and connecting the processor to a battery within the computing device; wherein at least one of the processor, the memory unit, the graphics processing unit, or the voltage regulator includes: an interface between a seed material and an epitaxial material, the epitaxial material having a second set of lattice parameters that is different from a first set of lattice parameters of the seed material by at least a threshold amount; and one or more quantum regions in the epitaxial material, the one or more quantum regions comprising a material that is elastically stiffer than the epitaxial material and that has a third set of lattice parameters that are within the threshold amount of the second set of lattice parameters.

Example 39

The method of Example 38, wherein the one or more quantum regions include indium phosphide (InP).

Example 40

The method of Example 38, wherein the one or more quantum regions include indium aluminum arsenide (InAlAs).

Example 41

A non-transitory computer-readable storage medium comprising computer-readable instructions stored thereon, the computer-readable instructions configured to instruct a processor to perform at least a portion of the method according to any one of Examples 13-17, 21-32, and 38-40.

Example 42

A means for performing at least a portion of the method according to any one of Examples 13-17, 21-32, and 38-40.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:
1. A semiconductor device comprising:
  a seed material having a first set of lattice parameters associated therewith;
  an epitaxial material in direct physical contact with the seed material, the epitaxial material having a second set of lattice parameters associated therewith that are different from the first set of lattice parameters by at least a threshold amount; and
  at least one quantum region comprising a material that has an elastic stiffness that is greater than an elastic stiffness of the epitaxial material and a third set of lattice parameters that are within the threshold amount from the second set of lattice parameters, the at least one quantum region disposed vertically between and in direct contact with an upper portion and a lower portion of the epitaxial material.
2. The semiconductor device of claim 1, wherein the seed material includes a crystalline silicon material.
3. The semiconductor device of claim 1, wherein the seed material includes an aspect ratio trapping (ART) trench thereon, and the epitaxial material is disposed in the ART trench.
4. The semiconductor device of claim 1, wherein the epitaxial material includes an active region including an electronic device therein or thereon and a passive region including the at least one quantum region therein.
5. The semiconductor device of claim 1, further comprising:
  a crystalline material in direct physical contact with the epitaxial material, the crystalline material having a fourth set of lattice parameters associated therewith that are different from the second set of lattice parameters by at least the threshold amount; and
  at least one other quantum region comprising a material that has an elastic stiffness that is greater than an elastic stiffness of the crystalline material and a fifth set of lattice parameters that are within the threshold amount from the fourth set of lattice parameters, the at least one other quantum region disposed within the crystalline material.
6. The semiconductor device of claim 1, wherein each one of the at least one quantum region is between about one half to five nanometers thick.
7. The semiconductor device of claim 1, wherein a number of quantum regions of the at least one quantum region is between one quantum region and twenty quantum regions.
8. The semiconductor device of claim 1, wherein the at least one quantum region comprises indium phosphide (InP).
9. The semiconductor device of claim 1, wherein the at least one quantum region comprises indium aluminum arsenide (InAlAs).
10. The semiconductor device of claim 1, wherein the epitaxial material includes a III-V semiconductor material.
11. The semiconductor device of claim 1, wherein the threshold amount is about three percent (3%).

12. The semiconductor device of claim 1, wherein the threshold amount is between about two percent (2%) and four percent (4%).

13. A method of forming a semiconductor device, the method comprising:
- disposing an epitaxial material on a seed material having a first set of lattice parameters associated therewith, the epitaxial material having a first elastic stiffness and a second set of lattice parameters associated therewith that is different from the first set of lattice parameters by at least a threshold amount;
- disposing a quantum region directly in contact with the epitaxial material, the quantum region having a second elastic stiffness that is greater than the first elastic stiffness and a third set of lattice parameters associated therewith that is within the threshold amount of the second set of lattice parameters; and
- disposing the epitaxial material directly in contact with the quantum region.

14. The method of claim 13, further comprising disposing another quantum region having the second elastic stiffness and the third set of lattice parameters associated therewith and disposing the epitaxial material on the another quantum region.

15. The method of claim 14, wherein disposing another quantum region and disposing the epitaxial material on the another quantum region is repeated less than about fifty times.

16. The method of claim 13, wherein disposing an epitaxial material on a seed material includes disposing the epitaxial material in an aspect ratio trapping (ART) trench.

17. The method of claim 13, wherein disposing a quantum region comprises disposing about one half to five nanometers of material of the quantum region.

18. A computing device comprising:
- a processor mounted on a substrate;
- a memory unit capable of storing data;
- a graphics processing unit;
- an antenna within the computing device;
- a display on the computing device;
- a battery within the computing device;
- a power amplifier within the processor; and
- a voltage regulator within the processor;
- wherein at least one of the processor, the memory unit, the graphics processing unit, or the voltage regulator comprises:
  - an interface between a seed material and an epitaxial material, the epitaxial material having a second set of lattice parameters that is different from a first set of lattice parameters of the seed material by at least a threshold amount; and
  - one or more quantum regions vertically between and in direct contact with an upper portion and a lower portion of the epitaxial material, the one or more quantum regions comprising a material that is elastically stiffer than the epitaxial material and that has a third set of lattice parameters that are within the threshold amount of the second set of lattice parameters.

19. The computing device of claim 18, wherein the one or more quantum regions include indium phosphide (InP).

20. The computing device of claim 18, wherein the one or more quantum regions include indium aluminum arsenide (InAlAs).

* * * * *